United States Patent [19]

Kuppers et al.

[11] Patent Number: 4,592,924
[45] Date of Patent: Jun. 3, 1986

[54] METHOD OF MANUFACTURING A REACTION VESSEL FOR CRYSTAL GROWTH PURPOSES

[75] Inventors: Paul D. Kuppers; Karl H. Schelhas, both of Aachen, Fed. Rep. of Germany; Cornelis H. J. van den Brekel, Nuenen; Giok D. Khoe, Eindhoven, both of Netherlands

[73] Assignee: U.S. Philips Corporation, New York, N.Y.

[21] Appl. No.: 643,336

[22] Filed: Aug. 22, 1984

[30] Foreign Application Priority Data

Aug. 27, 1983 [DE] Fed. Rep. of Germany ....... 3330910

[51] Int. Cl.[4] .................. B05D 3/02; B05D 7/22; C23C 16/00
[52] U.S. Cl. .................................. 427/45.1; 427/237; 427/255.3
[58] Field of Search ............ 427/45.1, 237, 255.3

[56] References Cited

U.S. PATENT DOCUMENTS

| 4,196,232 | 4/1980 | Schnable et al. | 427/255.3 |
| 4,262,035 | 4/1981 | Jaeger et al. | 427/237 X |
| 4,436,762 | 3/1984 | Lapatovich et al. | 427/237 X |
| 4,504,518 | 3/1985 | Ovshinsky et al. | 427/45.1 X |

Primary Examiner—Michael R. Lusignan
Attorney, Agent, or Firm—Norman N. Spain

[57] ABSTRACT

In order to prevent impurities, in particular a chlorine impurity, present in the wall of the vessel from diffusing into the interior of the vessel and there disturb the growth process of the crystal, a hollow member, in particular a tube (1), of quartz is provided on its inside with a coating of silicon dioxide, while argon, gaseous silane and a gaseous oxidant, for example, dinitrogen oxide and/or carbon dioxide are introduced into the hollow member heated at 250° to 350° C. and are converted by means of a microwave resonator (2) into a porous coating of silicon dioxide at a pressure between 20 and 30 mbar, which coating is sintered to form a coating which is preferably at least 50 μm thick.

4 Claims, 1 Drawing Figure

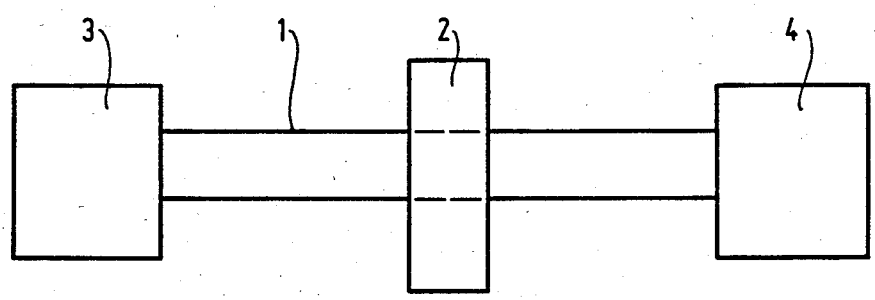

METHOD OF MANUFACTURING A REACTION VESSEL FOR CRYSTAL GROWTH PURPOSES

BACKGROUND OF THE INVENTION

The invention relates to a method of manufacturing a reaction vessel for crystal growing by providing a coating of silicon dioxide on the inside of a hollow member of quartz.

Such a method is known from DE-PS No. 962868 according to which a crucible for the manufacture of high-purity semiconductor materials is manufactured by coating a crucible of high-purity quartz on its inside with silicon dioxide. The silicon dioxide is obtained by rectification of silicon tetrachloride and subsequent hydrolysis with high-purity water. In this process a gel-like mass is formed which is provided on the inside of the crucible and is sintered there at approximately 1200° to 1400° C.

In DE-AS No. 29 28 089 such reaction vessels are referred to as "compound crucibles" and "compound tubes", respectively.

When such reaction vessels are used for crystal growth purposes it should be ensured that the impurities present in the wall of the vessel do not diffuse into the interior of the vessel and interfere there with the growth process of the crystal. During the investigations which led to the present invention it was found that in particular a chlorine contamination has a negative effect.

The method known from DE-PS No. 962868 is not suitable to prevent the chlorine contamination because in this method silicon tetrachloride, a chlorine-containing compound, is used as a starting compound.

SUMMARY OF THE INVENTION

It is the object of the present invention to provide a method which enables the deposition of chlorine-free layers on the inner wall of hollow members of quartz, in particular quartz tubes, in which silicon dioxide layers of a thickness which is sufficient to prevent diffusion of a chlorine contamination from the quartz tube through the silicon dioxide layer into the interior of the tube are produced in a short period of time.

According to the invention this object is achieved by a method of the kind mentioned in the opening paragraph in which argon, chlorine-free gaseous silane and a gaseous oxidant are introduced into the hollow member heated at 250° to 350° C. and are converted by means of a microwave resonator into a porous coating of silicon dioxide at a pressure between 20 and 30 mbar, which coating is sintered.

Dinitrogen oxide and/or carbon dioxide as gaseous oxidants are preferably introduced into the hollow member.

The conversion is preferably continued for such a period of time that the sintered coating has a thickness of at least 50 $\mu$m.

Thicker layers can also be deposited by several repetitions or by a longer duration of the process.

A method in which silicon dioxide is deposited from the gaseous phase on the inner wall of a heated quartz tube by means of a microwave resonator at a pressure of 1.33 to 13.3 mbar is known from DE-PS No. 24 44 100 as a preliminary stage in the manufacture of optical fibers. Since the silicon dioxide layer obtained in this manner is compact, a sintering afterwards is not necessary. The layer thickness may be a few hundred $\mu$m; the length of the layer is typically 1 m. The reaction yield is approximately 100%. It is possible to deposit a layer of a uniform thickness over the whole length. Since, however, silicon tetrachloride and oxygen are used as starting substances, these layers are not chlorine-free either.

A method of depositing a coherent readily adhering silicon dioxide layer which is vitreous, very hard and scratch-resistant, on the surface of a substrate in which silane and dinitrogen oxide in the gaseous state are subjected to a glow discharge at 0.5 mbar while a plasma discharge is produced by high frequency energy coupled in the reaction space inductively or capacitively and the deposited layer is uniformly distributed over the whole substrate by magnetic control of the plasma, is known from DE-PS No. 1521553. However, the rate of deposition is only 4 $\mu$m/hour. The manufacture of an at least 100 $\mu$m thick layer hence lasts 25 hours.

On the other hand the method according to the invention is carried out at a substantially higher pressure, namely at 20 to 30 mbar as mentioned above, and coating durations in the order of magnitude of only two hours are reached for layer thickness of 50 $\mu$m. In contrast with the methods mentioned above, no compact layers are obtained but porous layers which can be sintered to compact layers.

It is both surprising that in the method according to the invention porous layers are obtained in a high yield and also that said layers can be sintered to form compact layers. In itself it were to be expected that either a crystal layer is deposited or that as a result of reaction of the gas phase, in particular due to the higher pressure, dust particles are formed which are then carried away partly or entirely by the gas flow. A further favourable condition is that the layers can be sintered without gasbubbles being formed in the layer. This latter is not natural since in the case of the closed pores bubbles formation is to be taken into account.

It is to be noted that sintering of a gel-like mass as known from DE-PS No. 962868 differs from the sintering according to the invention of a porous coating of silicon dioxide in that the gel-like mass does not yet consist of silicon dioxide but of hydrated of silica. So in the known method the silicon dixode is formed only by sintering.

In the method according to the invention a complete sintering to form a crystal-clear layer is not always strictly necessary. When the provided layer is to serve as a barrier, a partial sintering may also suffice in case no connected open pore system remains.

BRIEF DESCRIPTION OF THE DRAWING

The sole FIGURE in the drawing is a diagrammatic view of a device used for carrying out the invention.

DESCRIPTION OF THE PREFERRED EMBODIMENTS

The invention will now be described in greater detail, by way of example, with reference to the drawing the sole FIGURE of which is a diagrammatic view of a device used for carrying out the invention.

A quartz tube 1 having an inside diameter of 12 mm and an outside diameter of 20 mm was used. The quartz tube was surrounded by a reciprocating resonator 2. The stroke of the resonator was 50 cm. An Ar/SiH$_4$ mixture having 3% SiH$_4$ was introduced into the tube. The overall flow of said mixture was 240 Ncm$^3$/minute, the N$_2$O flow was 34 Ncm$^3$/minute, where N means "in normal conditions" (0° C., 1 bar). The gas flows were adjusted by means of a gas supply system 3. The pressure which was maintained by means of a pump 4 was between 20 and 30 mbar, the temperature at the location of the deposition was approximately 300° C. The microwave power used which was coupled in the resonator 2 was 200 W. After the deposition experiment had proceeded for 2 hours, 2.8 g of porous material had been deposited which was sintered to form a crystal clear layer and heated thereafter to about 2000° C. by means of a flame.

A second porous layer was deposited on said layer the flow of the $SiH_4$/Ar mixture being 243.5 $Ncm^3$/minute and the $N_2O$ flow was 33.2 $Ncm^3$/minute. The pressure during the test was 25 to 30 mbar, the temperature was 340° C., the duration of the experiment was 1¾ hours. 2.6 g of material were deposited. The porous layer was then heat treated as before. The overall thickness of the sintered layer then was approximately 100 $\mu$m.

What is claimed is:

1. A method of manufacturing a reaction vessel for crystal growing by providing a coating of silicon dioxide on the inside of a hollow member of quartz, characterized in that a mixture of argon, chlorine-free gaseous silane and a gaseous oxidant is introduced into the hollow member heated at 250° to 350° C. and is converted by means of a microwave resonator into a porous coating of siicon dioxide at a pressure between 20 and 30 mbar, which coating is then sintered.

2. A method as claimed in claim 1, characterized in that dinitrogen oxide and/or carbon dioxide are introduced into the hollow member as gaseous oxidants.

3. A method as claimed in claim 1, characterized in that the conversion is continued until the sintered coating has a thickness of at least 50 $\mu$m.

4. A method as claimed in claim 2 characterized in that the conversion is continued until the sintered coating has a thickness of at least 50 $\mu$l m.

* * * * *

UNITED STATES PATENT AND TRADEMARK OFFICE
CERTIFICATE OF CORRECTION

PATENT NO. : 4,592,924

DATED : June 3, 1986

INVENTOR(S) : PAUL D. KUPPERS ET AL

It is certified that error appears in the above-identified patent and that said Letters Patent is hereby corrected as shown below:

IN THE CLAIMS:

Claim 4, column 4, line 19, change "50 $\mu$l m" to --50 $\mu$m--.

Signed and Sealed this

Twenty-seventh Day of January, 1987

Attest:

DONALD J. QUIGG

Attesting Officer    Commissioner of Patents and Trademarks